United States Patent [19]

Hefner et al.

[11] Patent Number: 5,254,484
[45] Date of Patent: Oct. 19, 1993

[54] METHOD FOR RECRYSTALLIZATION OF PREAMORPHIZED SEMICONDUCTOR SURFACES ZONES

[75] Inventors: Heinz-Achim Hefner, Brackenheim; Joachim Imschweiler, Heilbronn-Böckingen; Michael Seibt, Göttingen, all of Fed. Rep. of Germany

[73] Assignee: Telefunken electronic GmbH, Fed. Rep. of Germany

[21] Appl. No.: 764,615

[22] Filed: Sep. 24, 1991

[30] Foreign Application Priority Data

Nov. 10, 1990 [DE] Fed. Rep. of Germany ....... 4035842

[51] Int. Cl.⁵ .......................................... H01L 21/265
[52] U.S. Cl. ....................................... 437/24; 437/25; 437/27; 437/31; 437/82; 437/247; 437/950
[58] Field of Search .................... 437/24, 25, 27, 31

[56] References Cited

U.S. PATENT DOCUMENTS

| 4,683,645 | 8/1987 | Naguib et al. ................. 437/24 |
| 5,145,794 | 9/1992 | Kase et al. ..................... 437/27 |

FOREIGN PATENT DOCUMENTS

| 0027712 | 4/1981 | European Pat. Off. |
| 2449542 | 4/1975 | Fed. Rep. of Germany |
| 2823967 | 12/1978 | Fed. Rep. of Germany |
| 220812 | 4/1985 | Fed. Rep. of Germany |
| 220814 | 4/1985 | Fed. Rep. of Germany |
| 277552 | 4/1990 | Fed. Rep. of Germany |
| 59-84422 | 5/1984 | Japan |
| 63-155720 | 6/1988 | Japan |
| 1-196818 | 8/1989 | Japan |
| 8603334 | 6/1986 | PCT Int'l Appl. |
| 1269359 | 4/1972 | United Kingdom |

OTHER PUBLICATIONS

Proceedings Of The 1990 Bipolar Circuits And Technology Meeting, Minneapolis, Sep. 17/18, 1990; pp. 162-165, Ehinger et al.: "Progress in speed power performance of . . . ".
Applied Physics A. Solids And Surfaces, Bd. A47, Nr. 2, Oct. 1988, Heidelberg, DE; pp. 147-155, Wurm et al.: "Modulated Optical reflectance measurements on . . . ".
Applied Physics Letters, Bd. 52, Nr. 12, Mar. 21, 1988 New York US; pp. 963-965, Ozturk et al.: "Very shallow p+-n junction formation by . . . ".
Furukawa, S.: "Layered Structures and Interface . . . " D. Reidel Publishing Company/Dordrecht, Boston, London, 1984.

*Primary Examiner*—Olik Chaudhuri
*Assistant Examiner*—Ourmazd S. Ojan
*Attorney, Agent, or Firm*—Spencer, Frank & Schneider

[57] ABSTRACT

A method for thermal annealing of amorphous surface layers on a single-crystal semiconductor base element. The amorphous surface layer is obtained by implantation of germanium or silicon ions in a single-crystal silicon base element. Finally, the amorphous layer is doped by implantation of impurities and subjected to a three-step annealing process. During the first step of this process, the interface region between the amorphous layer and the single-crystal base element is smoothed at a temperature between 400° and 460° C., in the second step the amorphous layer recrystallizes at a temperature between 500° and 600° C., and in the third step the dopants are activated in an RTA process.

10 Claims, 1 Drawing Sheet

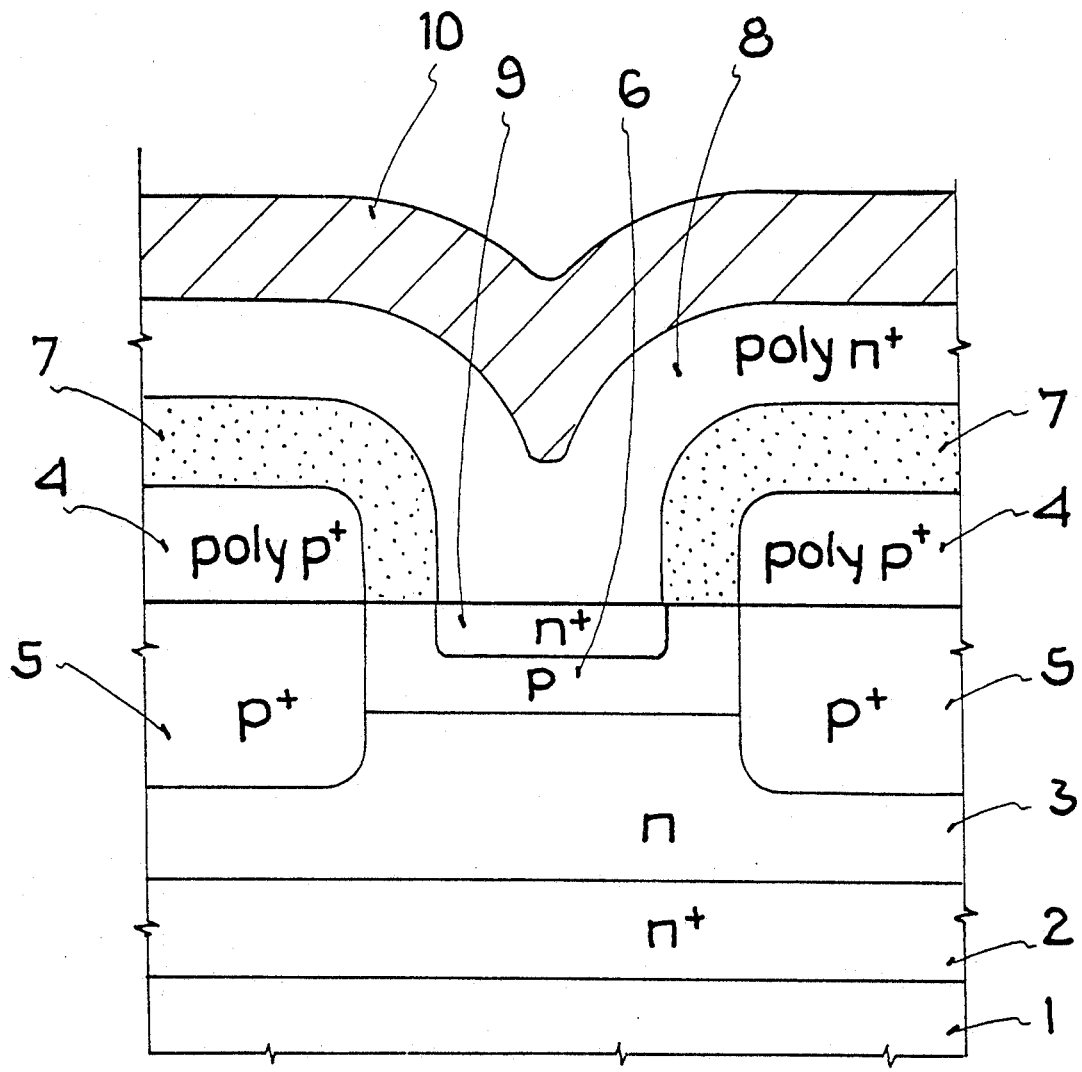
FIG.

METHOD FOR RECRYSTALLIZATION OF PREAMORPHIZED SEMICONDUCTOR SURFACES ZONES

BACKGROUND

1. Field of Invention

The invention relates to a method for manufacturing shallow junctions in silicon by implantation of silicon or germanium ions for amorphization of a surface zone, subsequent doping of this surface zone, and finally recrystallization of this surface zone by heat treatment. Furthermore, the invention relates to a semiconductor component containing a shallow junction of this type.

2. Description of the Related Art

To manufacture shallow pn-junctions in silicon, methods are also used whereby surface zones of single-crystal silicon are turned into an amorphous state by implantation of silicon or germanium ions. In a zone pretreated in this way, implanted dopants such as B, $BF_2^+$, P or As are very narrowly limited with regard to their penetration depth, anomalous (accelerated) diffusion and channeling. A steep dopant profile is the result. During recrystallization of the amorphous surface zone by means of solid-phase epitaxial growth, care must be taken when selecting the temperature so that the dopants do not diffuse too much, in order to retain the dopant profile.

In "J. Appl. Phys." Vol. 54, No. 12, December 1983, pages 6879-6889, a method is described whereby recrystallization takes place at a temperature of 925° C. for a duration of 20 minutes.

In EP 0 201 585, a two-step process for recrystallization of an amorphous surface zone is set forth, whereby the semiconductor specimen is initially held for about 30 minutes at 600° C., the amorphous layer being recrystallized by solid-phase epitaxy (SPE), and then heated within one second to more than 1000° C., as a result of which the implanted dopants are activated.

Both known methods have the drawback that in the recrystallized condition there are defects in the crystalline structure at the point where the interface region from amorphous to crystalline material was situated. These defects are primarily stacking faults and dislocation loops that greatly impair the electrical properties of the junction.

From "IEEE 1990 Bipolar Circuits and Technology Meeting 7.3", pages 162-165, a method is known whereby prior to recrystallization the interface area between the amorphous surface zone and the crystalline base material is smoothed in a temperature process at 450° C. for a duration of 30 minutes. In a subsequent rapid thermal annealing (RTA) process at 1075° C. over 10 seconds, the surface zone recrystallizes and the dopants are activated at the same time. After application of this known method, it was not possible to detect any further defects originating in the interface region, but a more intense boron diffusion had to be accepted in view of the high RTA temperature.

SUMMARY OF THE INVENTION

The object underlying the invention is to provide a method for the manufacture of shallow junctions ($\leq 0.1$ microns) in silicon in which defect-free recrystallization of the amorphous surface layer is ensured.

The invention describes a method for thermal annealing of amorphous surface layers on a single-crystal semiconductor base element. The amorphous surface layer is obtained by implantation of germanium or silicon ions in a single-crystal silicon base element. The amorphous layer is then doped by implantation of impurities and subjected to a three-step annealing process. During the first step of this process, the interface area between the amorphous layer and the single-crystal base element is smoothed at a temperature between 400° and 460° C. In the second step, the amorphous layer recrystallizes at a temperature between 500° and 600° C., and in the third step the dopants are activated in an RTA process.

BRIEF DESCRIPTION OF THE DRAWINGS

The FIGURE is a sectional view of a transistor whose base zone was made in accordance with the teachings of the instant invention.

DETAILED DESCRIPTION OF THE PREFERRED EMBODIMENT

The invention is described as follows on the basis of preferred embodiment.

In manufacturing a shallow junction in silicon, an amorphous surface layer is first generated on a single-crystal base element by implantation of ions. A mixture of $GeH_4/H_2$ is used as the ion source, with $^{70}Ge$ or $^{74}Ge$ isotopes being used for amorphization. The implantation energies are in a range from 50-150 keV with ion doses of about $2 \cdot 10^{14}$ cm$^{-2}$ to $9 \cdot 10^{14}$ cm$^{-2}$. An energy of approx. 70 keV with an ion dose of 3 to $5 \cdot 10^{14}$ cm$^{-2}$ has proved particularly advantageous.

For example, an implantation of 70 keV Ge ions at a dose of $3 \cdot 10^{14}$ cm$^{-2}$ gives an amorphous layer of approx. 85 nm thickness. An interface region with a thickness of approx. 15 nm is situated between the amorphous layer and the base element. In this interface region, the limit surface between the amorphous layer and the crystalline material of the base element is very rough and in which crystalline or amorphous islands exist in the region of the opposite structure respectively. The rough interface zone with its islands represents nuclei for the formation of lattice defects, particularly stacking faults and dislocation loops, during subsequent recrystallization.

In the next process step, the amorphous surface layer is doped by implantation of B, $BF_2^+$, P or As ions. In the amorphous layer, anomalous diffusion and channeling effects of the implanted ions are suppressed in an ideal fashion. A required doping profile can be set by appropriate selection of the ion energies. Implantation energies of 25 keV at a dose of $2 \cdot 10^{14}$ cm$^{-2}$ have proved to be of value in the case of $BF_2^+$ ions germanium and preamorphization at approx. 70 keV.

The recrystallization of the amorphous layer is preceded by a further process step effecting a smoothing of the rough interface zone. To do so, the semiconductor specimen is pretreated for approx. 30-50 minutes in a furnace at a temperature of approx. 400°-460° C. in a nitrogen atmosphere. At this temperature, a transformation of the amorphous layer does not yet take place, but the fractal interface zone is already smoothed, so that the amorphous and crystalline islands in particular recede.

In the subsequent heat treatment at a temperature of 500°-600° C. for a duration of 30-50 minutes, the amorphous layer recrystallizes by means of solid-phase epitaxial growth on the base crystal of the substrate. Since the rough interface zone has been smoothed before recrystallization proper, no stacking faults or dislocation loops can be found in the previously amorphous layer after the epitaxial growth. In particular, a temperature of 550° C. for a duration of 40 minutes in a nitrogen atmosphere has proved particularly advantageous for solid-phase epitaxy.

The final rapid thermal annealing activates the doping atoms at a temperature of 1000° C.-1100° C. without the dopant profile being able to substantially broaden during the brief duration of 5-10 secs. Since recrystallization proper took place at a temperature of 600° C., and only the dopant is now activated, no additional defects are created in the crystal structure in this process step.

An example for a typical application of a shallow junction as described above is a bipolar high-frequency transistor. However, a shallow junction of this type can also be used to advantage in other components, e.g. in diodes.

The figure shows a cross-section through a transistor whose base zone 6 was made using the method in accordance with the invention. Using known methods, first the buried collector connection 2 and the collector 3 are made on a semiconductor substrate 1. The p+-doped polysilicon layer 4 is used as the base connection and as the source for diffusing the extrinsic base 5. After further masking steps, the intrinsic base region 6 is amorphized by implantation of germanium. The energy of the germanium ion is here 70 keV. A dose of $2 \cdot 10^{14}$ cm$^{-2}$ is implanted. Then, the amorphized zone is doped by implantation of BF$_2^+$ ions at an energy of 25 keV and a dose of $3 \cdot 10^{14}$ cm$^{-2}$. Since implantation is into amorphous material, the dopant profile corresponds to an ideal distribution. Channeling and anomalous diffusion of the implanted ions are greatly reduced. The amorphized layer is now recrystallized in a furnace process. In the first process step, the interface region between the amorphous layer and the crystalline base crystal is smoothed at 450° C. Recrystallization of the amorphous layer does not yet take place in this process step, since the temperature is not sufficiently high for solid-phase epitaxial growth. After about 40 minutes, the temperature in the furnace is increased to 550° C. In this second process step, the amorphous layer recrystallizes almost without defects within 40 minutes, since the defect nuclei in the interface region have been removed in the previous process step. Before the dopants are activated by rapid thermal annealing, the polysilicon 8 is now deposited using known methods and then doped by As implantation. This polysilicon layer 8 has two functions; on the one hand it serves as an emitter connection and on the other hand it acts as a source for diffusing the emitter 9. The third part of the heat treatment in accordance with the invention now follows by rapid thermal annealing to 1000°-1200° C. In this step, the dopants of the base zone 6 are activated and at the same time the emitter zone 9 is diffused. By varying the duration of rapid thermal annealing in a range from 5-30 seconds, it is also possible to set the base width of the transistor. Finally, surface passivation and metallization 10 are performed using known methods.

With transistors produced in this way, limit frequencies of approx. 30 GHz are achieved.

What is claimed is:

1. A method for manufacturing a semiconductor array of silicon with a surface zone of low penetration depth, wherein: said surface zone is amorphized by implantation of germanium ions, at an energy of approximately 70 keV and a dose of approximately $3 \cdot 10^{14}$ cm$^{-2}$, in the surface of a single-crystal semiconductor element, said surface zone is then doped by BF$_2^+$ implantation at an energy of 15 keV to 25 keV and a dose of $3 \cdot 10^{13}$ cm$^{-2}$ to $3 \cdot 10^{14}$ cm$^{-2}$, and finally the amorphous layer is recrystallized by a heat treatment consisting of a first furnace process step whose temperature is selected such that recrystallization of said amorphous layer does not yet take place but the interface zone is smoothed between said amorphous surface zone and said single-crystal semiconductor element, said first step being followed by a second furnace process step whose temperature is sufficiently high for said amorphous surface zone to recrystallize and low enough for the movability of the implanted impurity atoms to remain low, and said second step being followed by a final rapid thermal annealing process at a temperature high enough for said implanted impurity atoms to be activated and for a duration short enough to minimize the redistribution of said impurities.

2. A method according to claim 1, wherein the first furnace process step lasts 30 to 50 minutes at a temperature of 400° to 460° C.

3. A method according to claim 2, wherein the second furnace process step lasts 30 to 50 minutes at a temperature of 500° to 600° C.

4. A method according to claim 3, wherein said rapid thermal annealing lasts 5 to 30 seconds at a temperature of 1000° to 1200° C.

5. Use of the method according to claim 1 for manufacture of a base zone of a bipolar high-frequency transistor.

6. A method for manufacturing a semiconductor array of silicon with a surface zone of low penetration depth comprising the steps of:
   a) implanting germanium ions at an energy of approximately 70 keV and a dose of approximately $3 \times 10^{14}$ cm$^{-2}$ in a single-crystal semiconductor element to amorphize a surface zone therein;
   b) doping said amorphous surface zone with impurity atoms by BF$_2^+$ implantation at an energy of 15 keV to 25 keV and a dose of $3 \times 10^{13}$ cm$^{-2}$ to $3 \times 10^{14}$ cm$^{-2}$;
   c) heating said amorphous surface zone at a first temperature which is sufficiently high to smooth an interface region between said surface zone and said single-crystal semiconductor element, and which is sufficiently low to prevent recrystallization of said amorphous surface zone;
   d) next, heating said amorphous surface zone at a second temperature which is sufficiently high to recrystallize said amorphous surface zone, and which is sufficiently low to minimize movement of said implanted impurity atoms; and
   e) thereafter, heating said recrystallized surface zone by a rapid thermal annealing process at a third temperature sufficiently high to activate said implanted impurity atoms and for a duration sufficiently short to minimize redistribution of said impurity atoms.

7. A method according to claim 6, wherein said heating step c) lasts 30 to 50 minutes at a temperature of 400° to 460° C.

8. A method according to claim 7, wherein said heating step d) lasts 30 to 50 minutes at a temperature of 500° to 600° C.

9. A method according to claim 8, wherein said rapid thermal annealing of step e) lasts 5 to 30 seconds at a temperature of 1000° to 1200° C.

10. Use of the method according to claim 6 for manufacture of a base zone of a bipolar high-frequency transistor.

* * * * *